United States Patent [19]

Bradley

[11] Patent Number: 5,374,902
[45] Date of Patent: Dec. 20, 1994

[54] ULTRA LOW PHASE NOISE MICROWAVE SYNTHESIZER

[75] Inventor: Donald A. Bradley, Morgan Hill, Calif.

[73] Assignee: Wiltron Company, Morgan Hill, Calif.

[21] Appl. No.: 60,755

[22] Filed: May 12, 1993

[51] Int. Cl.$^5$ .................. H03L 7/087; H03L 7/20; H03L 7/23

[52] U.S. Cl. .................. 331/2; 331/11; 331/14; 331/16; 331/25; 455/260

[58] Field of Search .................. 331/2, 10, 11, 14, 16, 331/17, 18, 25; 455/260

[56] References Cited

U.S. PATENT DOCUMENTS 4,763,083  8/1988  Edwards .................. 331/2

*Primary Examiner*—David Mis
*Attorney, Agent, or Firm*—Fliesler, Dubb, Meyer & Lovejoy

[57] ABSTRACT

An ultra low phase noise microwave synthesizer for providing an output signal having a frequency $F_O$ of from 2 GHz to 20 GHz using a first voltage controlled oscillator (VCO), a first frequency comparing circuit for driving said first VCO to a first selected frequency ($F_{idle}$), a first circuit including a first harmonic sampler for phase locking said first VCO to said first selected frequency ($F_{idle}$), a second VCO, a second frequency comparing circuit coupled to said first VCO for driving said second VCO to a second selected frequency ($F_{coarse}$), a second circuit coupled to said first VCO including a second harmonic sampler for phase locking said second VCO to said second selected frequency ($F_{coarse}$), a third VCO, and a third circuit coupled to said second VCO including a third harmonic sampler for phase locking said third VCO to said frequency $F_O$.

21 Claims, 4 Drawing Sheets

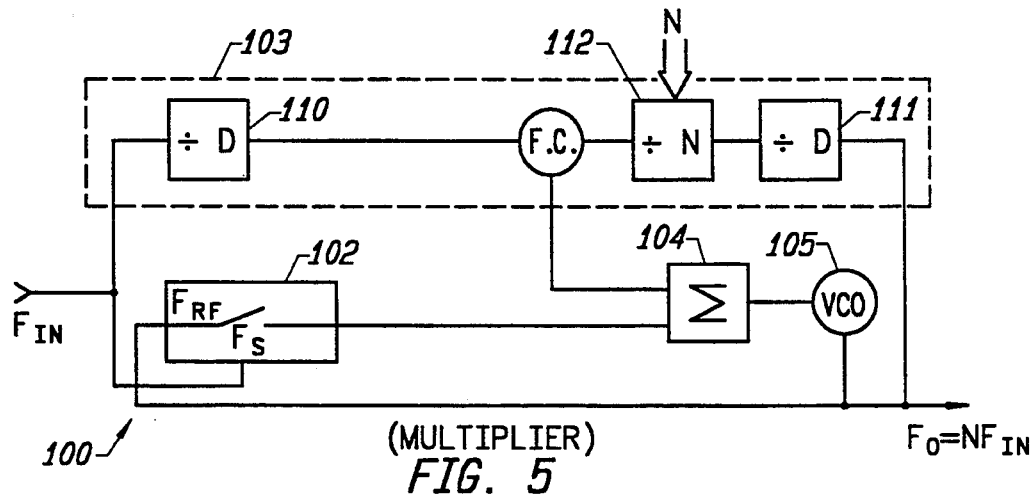
FIG. 5 (MULTIPLIER)
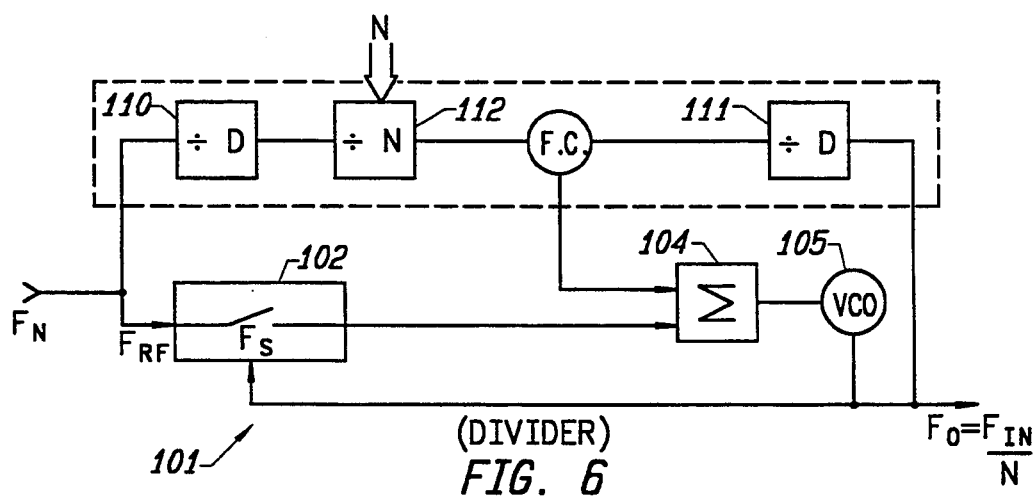
FIG. 6 (DIVIDER)
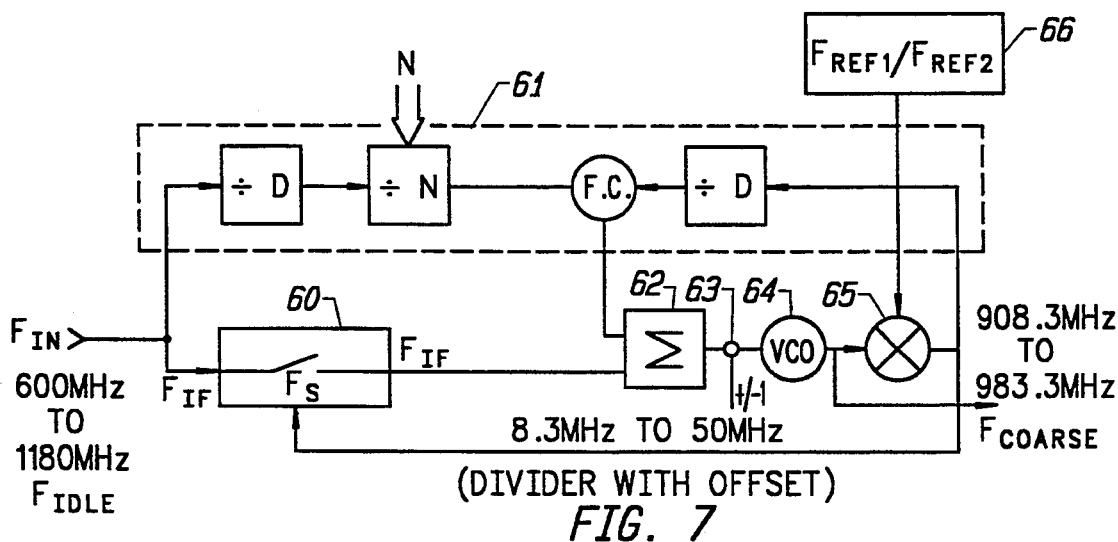
FIG. 7 (DIVIDER WITH OFFSET)

ULTRA LOW PHASE NOISE MICROWAVE SYNTHESIZER

BACKGROUND OF THE INVENTION

1. Field of the Invention

The present invention relates to microwave synthesizers in general and in particular to a method and apparatus comprising a means for eliminating digital divider noise in conjunction with a topology that reduces the harmonic number used in the synthesis of microwave signals.

2. Description of the Related Art

A microwave synthesizer is a circuit which is used for generating microwave signals of any frequency within a predetermined, generally broad, range of frequencies.

Heretofore, noise performance pertaining to synthesized microwave signal generation, in particular sources that must produce any frequency, such as a synthesizer, has been limited by digital divider noise and the multiplying nature of harmonic samplers increasing this noise by the harmonic number H. For example, the output frequency of prior known synthesizers can be represented by the following equation $$F_O = \frac{HF_{ref}}{P} - \frac{HNF_{step}}{P} + F_{fine} \quad (1)$$

wherein the frequency $F_{step}$, i.e. the midrange frequency, is multiplied by the harmonic number H.

SUMMARY OF THE INVENTION

In view of the foregoing, a principal object of the present invention is an ultra low phase noise microwave frequency synthesizer wherein digital divider noise is eliminated in conjunction with a topology that reduces the harmonic number used in the synthesis of microwave signals. Furthermore, the midrange frequency is no longer multiplied by the harmonic number H and the output frequency $F_O$ is given by an equation of the following form:

$$F_O = \frac{HF_{ref}}{P} - \frac{NF_{step}}{P} + F_{fine} \quad (2)$$

The synthesizer of the present invention is usable in a variety of applications, such as, for example, the front end of a spectrum analyzer.

In accordance with the above, there is provided a synthesizer comprising essentially three stages. In the first stage there is provided a circuit responsive to a reference frequency $F_{step}$ and a control signal corresponding to a frequency $F_{idle}$ for providing the frequency $F_{idle}$. In the second stage there is provided a circuit responsive to the frequency $F_{idle}$, a selected one of a pair of reference frequencies $F_{ref1}$ and $F_{ref2}$, and a control signal corresponding to a frequency $F_{coarse}$, control signals for selecting between $F_{ref1}$ and $F_{ref2}$ and a control signal for controlling a polarity circuit for providing the frequency $F_{coarse}$. In the third stage there is provided a circuit responsive to $F_{coarse}$, a reference frequency $F_{fine}$, and a plurality of control signals for controlling a programmable divider, the frequency $F_{fine}$ and a polarity circuit for providing an output signal having a frequency $F_O$ given by an equation of the following general form:

$$F_O = \frac{HF_{ref}}{P} + \frac{F_{step}}{P} - F_{fine} \quad (3)$$

In the circuit providing the frequency $F_{idle}$ there is provided a first harmonic sampler, a first programmable frequency presteer circuit, a first summing circuit and a first VCO. The frequency $F_{idle}$ is a selected multiple of the frequency $F_{step}$.

In operation, the control signal corresponding to the frequency $F_{idle}$ is applied to the first presteer circuit for driving the first VCO via the first summing circuit to the selected frequency $F_{idle}$. When the first VCO is at $F_{idle}$, the output of the first presteer circuit is rendered null and the first sampler takes over to phase-lock the first VCO via the first summing circuit to the selected frequency $F_{idle}$.

In the circuit providing the frequency $F_{coarse}$ there is provided a second harmonic sampler, a second programmable frequency presteer circuit, a second summing circuit and a second VCO, a polarity circuit, a mixer and a source of two reference frequencies $F_{ref1}$ and $F_{ref2}$.

In operation, the control signal corresponding to the selected frequency $F_{coarse}$ is applied to the second presteer circuit for driving the second VCO via the summing circuit to the selected frequency $F_{coarse}$. When the second VCO is at $F_{coarse}$, the output of the second presteer circuit is rendered null and the second sampler takes over to phase-lock the second VCO via the second summing circuit to the selected frequency $F_{coarse}$. The polarity circuit, mixer and reference frequencies $F_{ref1}$ and $F_{ref2}$ are used to provide a relatively low sampling frequency having a corresponding noise floor while providing $F_{coarse}$ at a relatively high frequency so as to minimize the harmonic number H in the circuit providing the output signal.

In the circuit providing the output signal having the frequency $F_O$ there is provided a programmable divider, a third harmonic sampler, a phase detector, a source of a reference frequency $F_{fine}$, a polarity circuit and a third VCO.

In operation, the programmable divider divides the frequency $F_{coarse}$ by a selected factor which is then used to sample the output of the third VCO to provide an error signal relative to the reference frequency $F_{fine}$. The polarity circuit controls the polarity of the response of the third VCO to the error signal to provide the output signal having the frequency $F_O$.

Among the important features of the present invention is the fact that the noise performance of the synthesizer of the present invention is at least 18.6 dBc/Hz better than prior known synthesizers operating over a comparable range of frequencies.

BRIEF DESCRIPTION OF THE DRAWINGS

The above and other objects, features and advantages of the present invention will become apparent from the following detailed description of the accompanying drawings, in which:

FIG. 5 is a block diagram of a multiplying circuit invented by applicant;

FIG. 6 is a block diagram of dividing circuit invented by applicant; and

FIG. 7 is a block diagram of a dividing circuit with frequency offset according to the present invention.

DESCRIPTION OF THE PREFERRED EMBODIMENTS

Figure 1:
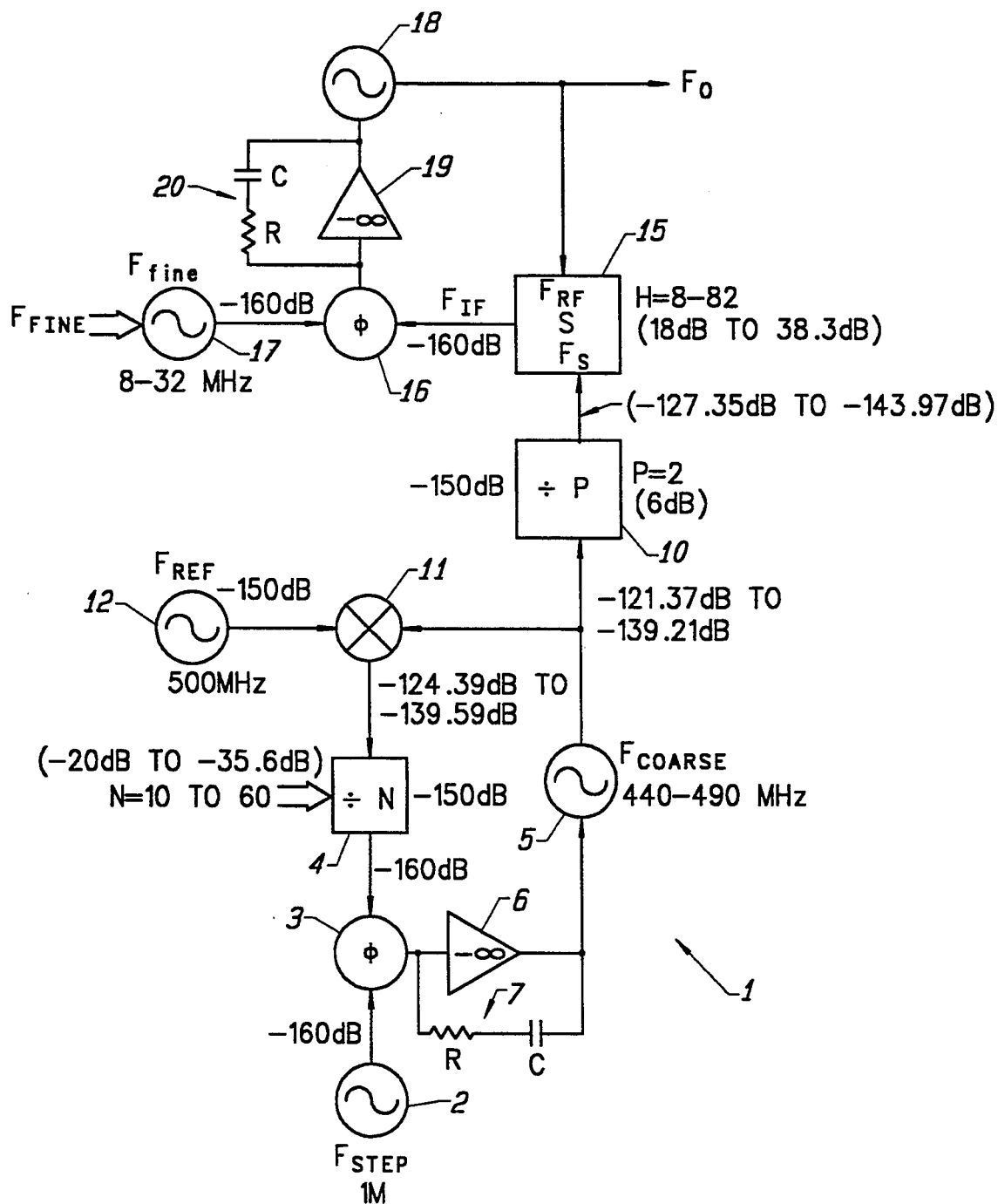
FIG. 1 is a block diagram of a prior known frequency synthesizer.
Figure 2:
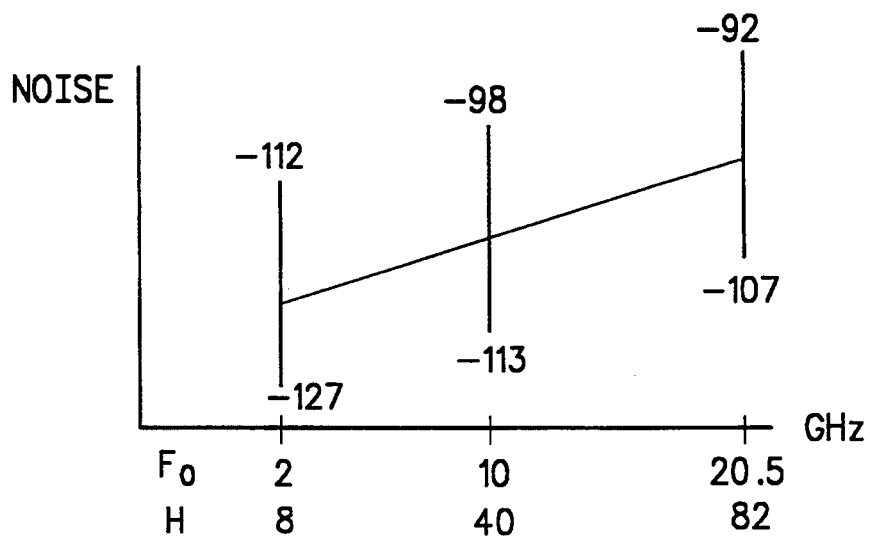
FIG. 2 is a drawing of the noise performance of the synthesizer of FIG. 1.

Referring to FIG. 1 there is illustrated a prior known frequency synthesizer designated generally as 1 for providing an output signal having a frequency $F_O$ in the range of 2 gigahertz (GHz) to 20 GHz. As seen in FIG. 2, the worst case noise performance of the circuit 1 is approximately $-112$ dBc/Hz at 2 GHz and $-92$ dBc/Hz at 20.5 GHz. The units dBc/Hz as used herein represent the single sideband (SSB) noise power in a one (1) Hz bandwidth offset from the carrier by 10 KHz.

In the synthesizer 1 there is provided an oscillator 2 comprising a frequency $F_{step}$, e.g. 1 megahertz (MHz), coupled to an input of a phase detector 3 having a second input coupled to the output of a programmable divider 4. The divider 4 is programmed by a control signal N for dividing the frequency of its input signal by a factor of from 10 to 60 depending on the desired frequency $F_O$. The output of the phase detector 3 is coupled to the control voltage input of a voltage-controlled oscillator (VCO) 5 by means of an operational amplifier 6 and an RC circuit 7 comprising a resistor R and a capacitor C. The output of the VCO 5 comprises a range of frequencies $F_{coarse}$, e.g. 440 MHz to 490 MHz, and is coupled to a prescaler 10 and one input of a mixer 11. A second input of the mixer 11 is coupled to an oscillator 12 having a frequency $F_{ref}$, e.g. 500 MHz. The output of the mixer 11 is coupled to an input of the divider 4.

The output of the prescaler 10 is provided to divide the frequency of its input signal by a predetermined factor, e.g. 2, and is coupled to the sampling input $F_S$ of a harmonic sampler 15. The output of the sampler 15 comprising an intermediate frequency $F_{IF}$ is coupled to one input of a phase detector 16. A second input of the phase detector 16 is coupled to the output of a tunable oscillator 17 which is adapted to provide an output having a range of frequencies $F_{fine}$, e.g. 8 MHz to 32 MHz depending on the desired frequency $F_O$. The output of the phase detector 16 is coupled to a voltage control input of a VCO 18 by means of an operational amplifier 19. An RC circuit 20 comprising a resistor R and a capacitor C is coupled between the input and output of the amplifier 19. The output of the VCO 18 is coupled to the high frequency $F_{ref}$ input of the sampler 15 and provides the output signal having the synthesized frequency $F_O$ wherein $$F_O = \frac{HF_{ref}}{P} - \frac{HNF_{step}}{P} + F_{fine} \tag{4}$$

As indicated above, the noise performance of apparatus used heretofore for synthesized microwave signal generation, in particular sources that have used conventional frequency dividers, have been limited by digital divider noise and the multiplying nature of harmonic samplers which heretofore has increased such noise by the harmonic number H of the sampler.

Digital divider noise has heretofore been a severely limiting factor in microwave circuits because of process dependent noise floors. For convenience, noise floors are defined herein in terms of noise power in connection with which the above-described units dBc/Hz are used. For example, in T$_2$L circuits which have a maximum operating frequency of approximately 100 megahertz (MHz), the noise floor is approximately $-160$ dBc/Hz. In Motorola emitter coupled logic (MECL) circuits which have a maximum operating frequency of approximately 600 MHz, the noise floor is approximately $-150$ dBc/Hz. In gallium-arsenide (GaAs) circuits, which have a maximum operating frequency of approximately 3000 MHz, i.e. 3 GHz, the noise floor is approximately $-130$ dBc/Hz. That is to say, each of the above-described circuits add the amount of noise indicated to the signal being processed therein.

To facilitate the following description of the noise performance of the prior art frequency synthesizer of FIG. 1, noise performance figures are provided for selected locations in the circuit. For example, the noise floor, i.e. noise power in the output, of the oscillator 2 which operates at 1 MHz is indicated as comprising $-160$ dBc/Hz, the noise floor of the oscillator 12 operating at 500 MHz is $-150$ dBc/Hz and the noise floor of the oscillator 17 operating at 8 MHz to 32 MHz is $-160$ dBc/Hz. For convenience and because of space limitations, the units dBc/Hz are abbreviated to dB in the drawings.

For purposes of the following description, a noise voltage level is defined by the following equation:

$$V_n = 10^{\frac{dBc/Hz - 13.01}{20}} \tag{5}$$

and the total noise resulting from the addition of two noise voltage levels is defined by the following equation:

$$V_{nt} = \sqrt{V_{n1}^2 + V_{n2}^2} \tag{6}$$

wherein $V_{n1}$ is a first noise voltage level and $V_{n2}$ is a second noise voltage level. Total noise power $P_{nt}$ is defined by:

$$P_{nt} = 20 \log V_{nt} + 13.01 \tag{7}$$

For example, the noise power in the output of the oscillator 2 coupled to the first of two inputs of the phase detector 3 which operates at 1 MHz is $-160$ dBc/Hz.

As is well known, the loop in which the phase detector 3 is located requires that the noise power in the signal applied to the second input of the phase detector 3 be equal to the noise power in the signal applied to the first input, i.e. $-160$ dBc/Hz. Working backward through the divider 4 and recognizing that if divider 4 was ideal, i.e. noise free, the noise power in the signal applied to its input would be higher by a factor of 20 log N, wherein N is the divisor. Thus, the noise power $P_{in}$ at the input of the divider 4 would be given by the following equation:

$$P_{in} = \text{noise power at output} + 20 \log N \tag{8}$$

where N=the divisor. For example, if the noise power in the output of divider 4 is −160 dBc/Hz, the noise power in its input would be calculated as follows:

For $N = 10$, (9)
$P_{in} = -160 \text{ dBc/Hz} + 20 \log 10$ (10)
$= -160 \text{ dBc/Hz} + 20(1)$ (11)
$= -140 \text{ dBc/Hz}.$ (12)

For $N = 60$, (13)
$P_{in} = -160 \text{ dBc/Hz} + 20 \log 60$ (14)
$= -160 \text{ dBc/Hz} + 35.6$ (15)
$= -124.4 \text{ dBc/Hz}.$ (16)

However, divider 4, like all conventional dividers, is not an ideal, noise free divider, but rather is also a source of noise. That is to say, the divider has a process dependent noise floor which depends on how it was made. For example, as indicated above, if the divider comprises a T²L circuit having a maximum operating frequency of approximately 100 MHz, it will have a noise floor of −160 dBc/Hz. If the divider is made using Motorola emitter coupled logic (MECL) technology having a maximum operating frequency of approximately 600 MHz, it will have a noise floor of −150 dBc/Hz. On the other hand, if the divider is made using gallium arsenide (GaAs) it will have a maximum operating frequency of approximately 3000 megahertz (MHz), i.e. 3 gigahertz (GHz) and a noise floor of −130 dBc/Hz.

Since dividers are not ideal, when calculating backward to determine the actual noise power in the input of a divider which produces a given noise power in its output, it is necessary to add the noise power at the input as if the divider were ideal to the noise floor of the divider, as follows:

$$V_{nt} = \sqrt{V_{n1}^2 + V_{n2}^2} \quad (17)$$

For dBc/Hz=−150, (divider noise) (18)

$$V_{n1} = 10^{\frac{-150-13.01}{20}} \quad (19)$$

$$V_{n1} = 10^{\frac{-163.01}{20}} \quad (20)$$

$V_{n1} = 10^{-8.15}$ (21)

$V_{n1} = 7.07 \times 10^{-9}$ (22)

$(V_{n1})^2 = 5.00 \times 10^{-17}$ (23)

For dBcHz=−124.4, (theoretical noise in input) (24)

$$V_{n1} = 10^{\frac{-124.4-13.01}{20}} \quad (25)$$

$V_{n2} = 10^{-6.87}$ (26)

$V_{n2} = 1.35 \times 10^{-7}$ (27)

$(V_{n2})^2 = 1.8233 \times 10^{-14}$ (28)

Adding the two noise powers, one obtains:

$$V_{nt} = \sqrt{V_{n1}^2 + V_{n2}^2} \quad (29)$$

$$V_{nt} = \sqrt{(7.07 \times 10^{-9})^2 + (1.35 \times 10^{-7})^2} \quad (30)$$
$= 1.35 \times 10^{-7}$ (31)

$P_{nt} = 20 \log V_{nt} + 13.01$ dBc/Hz (32)

$P_{nt} = 124.39$ dBc/Hz (actual noise in input) (33)

Similarly:

For dBc/Hz=−140, (theoretical noise in input) (34)

$$V_{n3} = 10^{\frac{-140-13.01}{20}} \quad (35)$$

$V_{n3} = 10^{-7.65}$ (36)

$V_{n3} = 2.236 \times 10^{-8}$ (37)

$(V_{n3})^2 = 5 \times 10^{-16}$ (38)

Adding the two noise powers $V_{n1}$ and $V_{n3}$, one obtains:

$$V_{nt} = \sqrt{(5 \times 10^{-17}) + (5 \times 10^{-16})} \quad (39)$$
$= 2.345 \times 10^{-8}$ (40)

$P_{nt} = 20 \log V_{nt} + 13.01$ dBc/Hz (41)

$P_{nt} = 139.59$ dBc/Hz (actual noise in input) (42)

Using the same techniques described above for calculating the noise power at the input of the mixer 11 and the prescaler 10, it will be found that the noise power is just slightly less than the noise power at the output of the mixer 11. That is to say, when the calculations are performed and the noise floor of the oscillator 12 is added to the noise power at the output of the mixer 11 as indicated in equations (33) and (42) above, it will be found that the sum of the noise powers is from −139.21 dBc/Hz to −121.37 dBc/Hz.

Calculating the noise power at the output of the prescaler 10 wherein the prescaler 10 divides the frequency of its input signal by a factor of 2, it will be found that if the prescaler 10 were ideal, the noise power at the output of the prescaler 10 would be reduced by a factor of 20 log P or 6 dBc/Hz to provide a theoretical noise power of 127.37 dBc/Hz to −145.21 dBc/Hz. However, because of the −150 dBc/Hz noise floor of the prescaler 10, using the above-described equations for calculating the actual noise power including the noise floor, it will be found that the actual noise power at the output of the prescaler 10 is −127.35 dBc/Hz to 143.97 dBc/Hz.

Referring to FIG. 2, the noise power in the high frequency input signal $F_{RF}$ to the sampler 15, which is also the noise power in the output signal having the frequency $F_O$, is a function of the harmonic number of the sampler 15 which, as shown in FIG. 1, ranges from 8 to 82. As is well known in samplers, the noise is multiplied by the harmonic number H. Thus, the noise in the high frequency input and consequently in the output signal having the frequency $F_O$ wherein 20 log 8=18 dBc/Hz and 20 log 82=38.3 dBc/Hz, ranges from −112 dBc/Hz to −127 dBc/Hz for H=8 and from −92 dBc/Hz to −107 dBc/Hz for H=82, as shown in FIG. 2.

As indicated above, the output frequency for the circuit of FIG. 1 is given by an equation of the following general form:

$$F_O = \frac{HF_{ref}}{P} - \frac{HNF_{step}}{P} + F_{fine} \tag{43}$$

Figure 3:
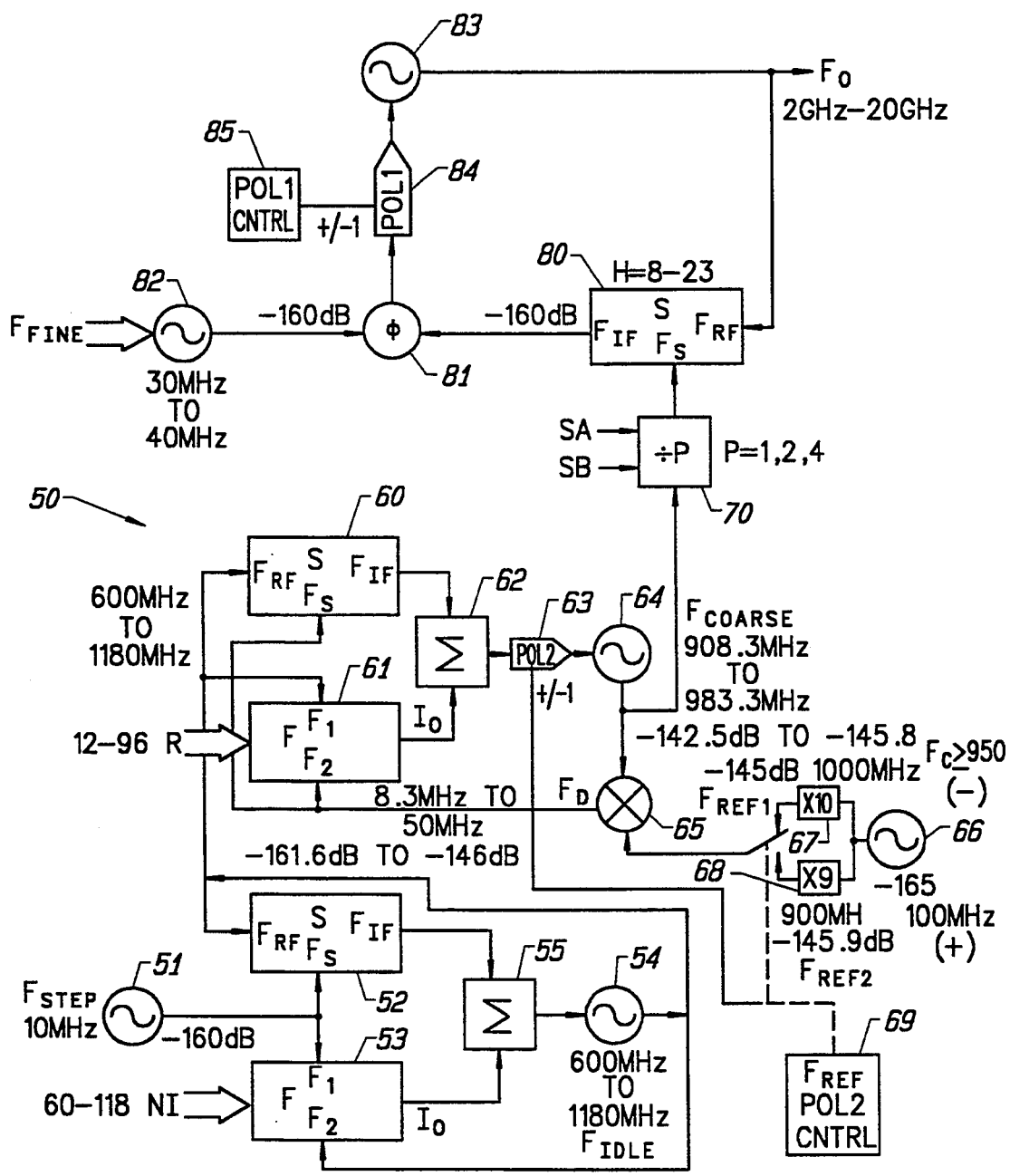
FIG. 3 is a block diagram of a frequency synthesizer according to the present invention.

Referring to FIG. 3, there is provided in accordance with the present invention an ultra low phase noise microwave synthesizer designated generally as 50. In the synthesizer 50 there is provided an oscillator 51 for providing an output signal having a frequency $F_{step}$, e.g. 10 MHz. The oscillator 51 has a noise floor of −160 dBc/Hz. The output of the oscillator 51 is coupled to the sampling input $F_S$ of a first harmonic sampler 52 and a first frequency input $F_1$ of a first frequency presteer circuit F, also designated 53. The intermediate frequency output of the sampler 53 designated $F_{IF}$ is coupled to a first input of a summing circuit 55. The output $I_O$ of the first presteer circuit 53 is coupled to a second input of the summing circuit 55. The output $I_O$ of the summing circuit 55 is coupled to the control voltage input of a voltage-controlled oscillator (VCO) 54. The output of the VCO 54 is coupled to the high frequency input designated $F_{RF}$ of the sampler 52, to a second frequency input $F_2$ of the first presteer circuit 53, to the high frequency input designated $F_{RF}$ of a second harmonic sampler 60 and to a first frequency input $F_1$ of a second presteer circuit 61. As will be further described below, the first presteer circuit 53 is also provided with an input designated N1 for receiving a control signal corresponding to a multiplier for multiplying the frequency $F_{step}$ by a factor of from 60 to 118 for controlling the frequency $F_{idle}$ of the VCO 54 over the frequency range of from 600 MHz to 1180 MHz.

The output of the second sampler 60 designated $F_{IF}$ and the output $I_O$ of the second presteer circuit 61 are coupled to a summing circuit 62. The output of the circuit 62 is coupled to a polarity control circuit 63. Circuit 63 having an output designated POL2 is responsive to a control signal from a circuit 69 for controlling the 10 polarity of the output of the summing circuit 62, i.e. inverting (−) and not inverting (+) said output, applied to the voltage-controlled oscillator 64. The VCO 64 provides an output having a frequency $F_{coarse}$ which ranges from 908.3 MHz to 983.3 MHz.

The output of the VCO 64 is coupled to one input of a mixer 65 and the input of a programmable divider 70. A second input of the mixer 65 is coupled to a source of a first reference frequency $F_{ref1}$, e.g. 1000 MHz, i.e. 1 GHz, and a second reference frequency $F_{ref2}$, e.g. 900 MHz. In practice, the frequencies $F_{ref1}$ and $F_{ref2}$ are obtained by multiplying the frequency, e.g. 100 MHz, of the output of an oscillator 66 by a factor of 10 and 9, respectively, using multipliers 67 and 68. The oscillator 66 has a noise floor of −165.

In practice, the output of the mixer 65 is restricted to a frequency range of from 8.3 MHz to 50 MHz by selecting between reference frequencies $F_{ref1}$ and $F_{ref2}$ and by controlling the polarity of the output POL2 of the polarity circuits 63 as a function of frequency $F_{coarse}$. Thus, when $F_{coarse} \geq 950$ MHz, $F_{ref1}$ and POL2(−) are selected and when $F_{coarse} < 950$ MHz, $F_{ref2}$ and POL2(+) are selected.

The output of the mixer 65 is coupled to the sampling input $F_S$ of the second sampler 60 and to a second frequency input $F_2$ of the second presteer circuit 61. As will be further described below, the second presteer circuit 61 is also provided with an input R for receiving a control signal corresponding to a divisor for dividing the frequency $F_{idle}$ by a factor of from 12 to 96 for controlling, in conjunction with the sampler 52, the polarity circuit 63, the mixer 65, the summing circuit 55 and the source of reference frequencies $F_{ref1}$ and $F_{ref2}$, the frequency $F_{coarse}$ of the VCO 64 over the frequency range of 908.3 MHz to 983.3 MHz. As indicated above, the selection of the reference frequencies $F_{ref1}$ and $F_{ref2}$ and the polarity of the output of the circuit 63 depends on the frequency $F_{coarse}$.

The programmable divider 70 has a pair of inputs designated SA and SB and is programmed to divide by 1, 2 or 4. The output of the divider 70 is coupled to the sampling input designated $F_S$ of a harmonic sampler 80. In conjunction with the operation of the system the sampler 80 operates over a range of harmonic numbers of from 8 to 23. The intermediate frequency output designated $F_{IF}$ of the sampler 80 is coupled to one input of a phase detector 81. A second input of the phase detector 81 is coupled to an oscillator 82. The oscillator 82, which has a noise floor of −160 dBc/Hz, provides an output having a frequency $F_{fine}$ which ranges from 30 MHz to 40 MHz in response to a control signal $F_{fine}$. The output of the phase detector 81 is coupled to a voltage-controlled oscillator 83 by means of a polarity control circuit 84 having an output designated POL1 which is responsive to a control signal from a source 85 for controlling the polarity of the signal from the phase detector 81 applied to the VCO 83, i.e. for inverting (−) or not inverting (+) the signal. The output of the VCO 83 provides the output signal of the synthesizer 50 having a frequency $F_O$ of from 2 GHz to 20 GHz and is coupled to the high frequency input designated $F_{RF}$ of the sampler 80.

To provide a selected output frequency $F_O$, a computer programmed in accordance with the listing shown in the appendix attached hereto and incorporated herein, is used to generate the control signals, N1, R, POL1, POL2 and P and to select the reference frequencies $F_{ref1}$ and $F_{ref2}$, such that the output frequency $F_O$ is given by the following equations:

$$\text{CASE1 } F_O = \frac{HF_{ref2}}{P} + \frac{NF_{step}}{P} + F_{fine}POL1(+)POL2(+) \tag{44}$$

$$\text{CASE2 } F_O = \frac{HF_{ref2}}{P} + \frac{NF_{step}}{P} - F_{fine}POL1(-)POL2(+) \tag{45}$$

$$\text{CASE3 } F_O = \frac{HF_{ref1}}{P} - \frac{NF_{step}}{P} + F_{fine}POL1(+)POL2(-) \tag{46}$$

$$\text{CASE4 } F_O = \frac{HF_{ref1}}{P} - \frac{NF_{step}}{P} - F_{fine}POL1(-)POL2(-) \tag{47}$$

The values of P and H for each of three bands of frequencies is given below:

$$2G \leq F_O \leq 5.1875G \; P=4, \; H=8-21 \tag{48}$$

$$5.1875G < F_O \leq 10.86G \; P=2, \; H=11-23 \tag{49}$$

$$10.86G < F_O \leq 20G \; P=1, \; H=12-21 \tag{50}$$

In general, P is chosen by the computer so that the harmonic number H of the sampler 80 is kept as low as possible.

Figure 4:
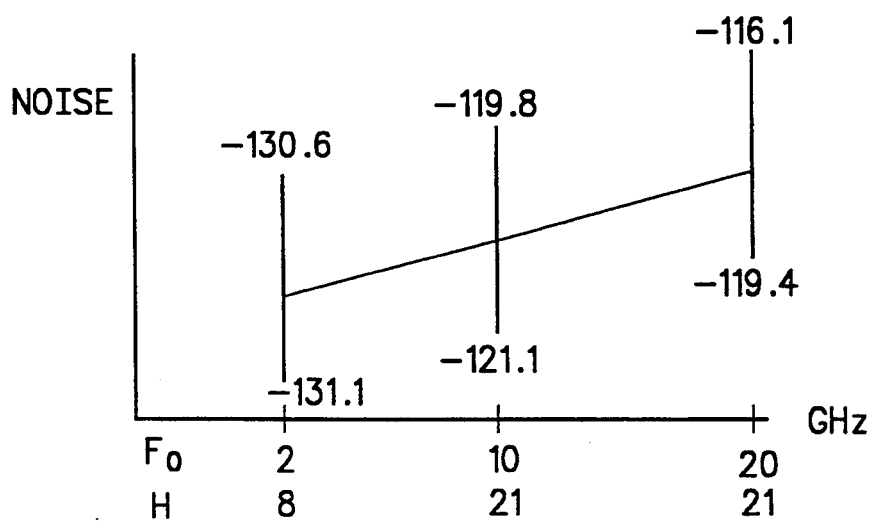
FIG. 4 is a drawing of the noise performance of the synthesizer of FIG. 3.

Referring to FIG. 4, over the frequency range of interest, the worst case noise performance of the circuit of FIG. 3 is from $-130.6$ dBc/Hz at 2 GHz to $-116.1$ dBc/Hz at 20 GHz, or an improvement of from 18.6 dBc/Hz at 2 GHz to 24.1 dBc/Hz at 20 GHz over the noise performance of the prior known synthesizer of FIG. 1.

The circuits for generating the frequencies $F_{idle}$ and $F_{coarse}$ comprise novel circuits for frequency multiplication and division, respectively, such as those disclosed in applicant's copending application Ser. No. 08/051,624, filed Apr. 22, 1993, entitled ULTRA LOW NOISE FREQUENCY DIVIDER/MULTIPLIER, the contents of which are incorporated herein by reference.

Referring to FIGS. 5 and 6, there is provided a multiplication circuit 100 and a division circuit 101, respectively. As more fully described in said application, each of the multiplication and division circuits 100 and 101 comprises a harmonic sampler 102, a presteer circuit 103, a summing circuit 104 and a VCO 105. The presteer circuit 103 comprises a pair of identical prescalers 110 and 111 and a programmable divider 112.

In the operation of each of the circuits 100 and 101 the harmonic sampler 102 is used to phase lock the VCO 105 to a frequency. However, due to the fact that the intermediate frequency $F_{IF}$ of a sampler can phase lock a VCO to any harmonic or subharmonic of the frequency applied to its sampling input, something else is required to drive the VCO to a predetermined frequency. To accomplish this, the presteer circuit 103 is used to compare the frequency applied to the sampling input of the sampler 102 with the frequency of the VCO 105 and, in response to a control signal corresponding to the desired VCO frequency, drive the VCO 105 to the desired frequency. Once the VCO 105 is at the desired frequency, the output of the presteer circuit 103 ceases to control the VCO frequency and it becomes phase locked thereto by the intermediate frequency $F_{IF}$ of the sampler 102.

Referring to FIG. 7, the operation of the division circuit comprising the sampler 60 and presteer circuit 61 is substantially the same as described above with respect to the circuit 101, except that the polarity circuit 63, mixer 65 and reference frequency source 66 are interposed in the VCO 64 voltage control and output circuits to offset the output frequency $F_{coarse}$ of the VCO 64 from a fraction of the frequency $F_{idle}$ to a much higher frequency, e.g. 908.3 MHz to 983.3 MHz, thereby reducing the harmonic number of the following harmonic sampler 80.

To determine the noise performance of the circuit of FIG. 3, and specifically the noise power in the output of the mixer 65, a ratio of the frequency range of 8.3 MHz to 50 MHz at the output of the mixer 65 and the frequency $F_{step}$, e.g. 10 MHz, of the oscillator 51 is calculated and found to extend from 8.3/10 to 50/10, or a value of 0.83 to 5.0. For frequencies wherein the ratio is less than 1, the circuits comprising the VCO's 54 and 64 operate as a divider. When the ratio is greater than 1, the circuits operate as a multiplier. Recognizing that the noise power in the output of the mixer 65 will be reduced or increased proportionately and using the above-described formula for calculating noise power, e.g. $P_n = 20 \log N$ dBc/Hz, where N is a divisor or a multiplier, the noise power in the signal at the output of the mixer 65 relative to the noise power in the output of the oscillator 51 is calculated as follows:

$$20 \log 0.83 = -1.62 \text{ dBc/Hz} \quad (51)$$

$$20 \log 5 = 14 \text{ dBc/Hz} \quad (52)$$

Adding these noise figures to the noise floor of the oscillator 51, it will be found that the noise power in dBc/Hz in the output of the mixer 65 ranges from a low of $-161.60$ ($-160-1.62$) to a high of $-146$ ($-160+14$).

Given that the noise power in the output of the mixer ranges from $-161.6$ dBc/Hz to $-146$ dBc/Hz and that the noise power in the reference signals $F_{ref1}$ and $F_{ref2}$ applied to one of the mixer inputs ranges from $-145$ dBc/Hz to $-145.9$ dBc/Hz, respectively, the noise power in the output of the VCO 64 and thus in the input to the programmable divider 70 can be calculated by adding the noise powers together as follows.

Using the general equation $$V = 10^{\frac{-dBc/Hz - 13.01}{20}} \quad (53)$$

and calculating the noise voltage levels in each reference signal, one obtains $$V_{-145} = 1.26 \times 10^{-8} \quad (54)$$

$$V_{-145.9} = 1.13 \times 10^{-8} \quad (55)$$

and at the maximum and minimum frequencies $F_D$, one obtains $$V_{-161.6} = 1.85 \times 10^{-9} \quad (56)$$

$$V_{-146} = 1.12 \times 10^{-8} \quad (57)$$

Adding each of the noise voltage levels together using the general equations $$V_{nt} = \sqrt{V_a^2 + V_b^2} \quad (58)$$

$$P_{nt} = 20 \log V_{nt} + 13.01 \quad (59)$$

one obtains the following:

$$V_{nt}(V_{-145} + V_{-161.6}) = 1.27 \times 10^{-8} \quad (60)$$

$$P_{nt} = 144.9 \quad (61)$$

$$V_{nt}(V_{-145} + V_{-146}) = 1.69 \times 10^{-8} \quad (62)$$

$$P_{nt} = -142.5 \quad (63)$$

$$V_{nt}(V_{-145.9} + V_{-161.6}) = 1.15 \times 10^{-8} \quad (64)$$

$$P_{nt} = -145.8 \quad (65)$$

$$V_{nt}(V_{-145.9} + V_{-146}) = 1.59 \times 10^{-8} \quad (66)$$

$$P_{nt} = -142.96 \quad (67)$$

From the foregoing, it can be seen that the maximum and minimum noise powers in the input to the programmable divider 70 ranges from a low of $-145.8$ dBc/Hz to a high of $-142.5$ dBc/Hz.

The importance of using the two reference frequencies $F_{ref1}$ and $F_{ref2}$ in conjunction with the polarity circuit 63 to provide $F_{coarse}$ and keep the frequency at the output of the mixer 65 within the range of 8.3 MHz to 50 MHz with a relatively low noise power over that range, e.g. $-161.6$ dBc/Hz to $-146$ dBc/Hz, becomes evident when the noise figures are calculated using only one of the reference frequencies. For example, if only reference frequency $F_{ref1}$, i.e. 1000 MHz, is used, the frequency $F_D$ at the output of the mixer 65 would range from 16.7 MHz to 91.7 MHz. Calculating the ratio of the frequency $F_D$ to the frequency $F_{step}$, one obtains the following:

$$\frac{16.7 \text{ MHz}}{10 \text{ MHz}} = 1.67 \tag{68}$$

$$\frac{91.7 \text{ MHz}}{10 \text{ MHz}} = 9.17 \tag{69}$$

Using the equation 20 log N and algebraically adding the result to the noise floor $-160$ dBc/Hz of the oscillator 51, the noise power at the minimum and maximum frequency $F_D$ in the output of the mixer 65 is then calculated as follows:

$$20 \log 1.67 = 4.45 \text{ dBc/Hz} \tag{70}$$

$$-160 \text{ dBc/Hz} + 4.45 \text{ dBc/Hz} = -155.6 \text{ dBc/Hz} \tag{71}$$

$$20 \log 9.71 = 19.74 \text{ dBc/Hz} \tag{72}$$

$$-160 \text{ dBc/Hz} + 19.74 \text{ dBc/Hz} = -140.3 \text{ dBc/Hz} \tag{73}$$

Adding the noise power of $-145$ dBc/Hz in the reference frequency $F_{ref1}$ applied to one input of the mixer 65 to the above calculated noise powers in the output of the mixer 65, one obtains the noise powers in the signal applied to the second input of the mixer 65, which corresponds to the frequency $F_{coarse}$, as follows:

$$V = 10^{\frac{-dBc/Hz-13.01}{20}} \tag{74}$$

where dBc/Hz is the noise floor in the reference signal having the frequency $F_{ref1}$. From equations (70) and (72) above:

$$V_1 = V_{-145} = 1.26 \times 10^{-8} \tag{75}$$

$$V_2 = V_{-155.6} = 3.71 \times 10^{-9} \tag{76}$$

$$V_3 = V_{-140.3} = 2.16 \times 10^{-8} \tag{77}$$

$$V_{nt} = \sqrt{V_1^2 + V_2^2} \tag{78}$$

$$V_{nt} = 2.19 \times 10^{-8} \tag{79}$$

$$P_{nt} = 20 \log V_{nt} + 13.01 \tag{80}$$

$$P_{nt} = -144.6 \text{ dBc/Hz} \tag{81}$$

$$V_{nt} = \sqrt{V_1^2 + V_3^2} \tag{82}$$

$$V_{nt} = 2.5 \times 10^{-8} \tag{83}$$

$$P_{nt} = -139 \text{ dBc/Hz} \tag{84}$$

Referring to the following comparison, it can be seen that if only $F_{ref1}$ is used to generate $F_{coarse}$, the noise power in the output of the VCO 64 is increased by more than 6 dBc/Hz.

$F_D$  8.3 MHz to 50 MHz    $-142$ to  $-145.8$ $F_D$  16.7 MHz to $-91$ MHz    $-144$ to  $\frac{-139.4}{-6.4}$ The above analysis shows that the noise performance is also reduced when the reference frequency is restricted to $F_{ref2}$ of 900 MHz. Thus, using equations (74) and (78) above, a noise floor of $-145.9$ dBc/Hz for the reference signal and a frequency range of from 8.3 MHz (983.3−900) to 83.3 MHz (983.3−900), the following is calculated:

$$\frac{8.3}{10} = .83 \tag{85}$$

$$\frac{83.3}{10} = 8.33 \tag{86}$$

$$20 \log 0.83 = -1.61 \tag{87}$$

$$20 \log 8.33 = 18.4 \tag{88}$$

$$-160 - 1.61 = -161.6 \tag{89}$$

$$-160 - 18.4 = -141.6 \tag{90}$$

$$V_{-161.6} = 1.85 \times 10^{-9} \tag{91}$$

$$V_{-141.6} = 1.89 \times 10^{-8} \tag{92}$$

$$V_{-145.9} = 1.13 \times 10^{-8} \tag{93}$$

$$V_{nt}(V_{-145.9} + V_{-161.6}) = 1.15 \times 10^{-8} \tag{94}$$

$$P_{nt} = 145.8 \text{ dBc/Hz} \tag{95}$$

$$V_{nt}(V_{-145.9} + V_{-141.6}) = 2.18 \times 10^{-8} \tag{96}$$

$$P_{nt} = 140.2 \tag{97}$$

Comparing the above results with the results using two reference frequencies, it can be seen that the noise power in the output of the VCO 64 is increased by more than 3 dBc/Hz.

8.3 MHz to 50 MHz    $-142.5$  to $-145.8$ 16.7 MHz to 91 MHz   $\frac{-139.4}{3.1}$ to $-140.2$ Operating at 908.3 MHz to 983.3 MHz the divider 70 comprises MECL technology having a noise floor of $-150$ dBc/Hz. To calculate the noise power in the output signal of the divider 70, the divider output noise power due to dividing the noise power in the input signal by the divisor 1, 2 or 4 is decreased by the noise floor of the divider. This can be calculated by algebraically adding the two together as described above, such that the noise power in the output signal has the value shown in the following table for each value of P.

| P = 1 | P = 2 | P = 4 |
|---|---|---|
| −142.5 | −146.2 | −148.7 |

-continued

| P = 1 | P = 2 | P = 4 |
|-------|-------|-------|
| −145.8 | −147.5 | −149.2 |

Referring to FIG. 4, given the above values of the noise power in the signal applied to the sampling input $F_S$ of the sampler 70 and the harmonic number of the sampler 70 derived by the computer program for selected output frequencies $F_O$, the noise power in the output signal $F_O$ for various values of H and P at the selected frequencies can be calculated and have the following values:

2 GHz ($H = 8$) ($P = 4$) noise  −148.7 + 18.06 = −130.6   (98)
                                                     −149.2 + 18.06 = −131.1   (99)
10 GHz ($H = 21$) ($P = 2$) noise  −146.2 + 26.4 = −119.8   (100)
                                                     −147.5 + 26.4 = −121.1   (101)
20 GHz ($H = 21$) ($P = 1$) noise  −142.5 + 26.4 = −116.1   (102)
                                                     −145.8 + 26.4 = −119.4   (103)

While a preferred embodiment of the present invention is described above, it is contemplated that numerous modifications may be made thereto for particular applications without departing from the spirit and scope of the present invention. Accordingly, it is intended that the embodiments described be considered only as illustrative of the present invention and that the scope thereof should not be limited thereto but be determined by reference to the claims hereinafter provided.

APPENDIX

```
10  REM ! ULPNALG ! DAB 01/18/92 ! ULTRA LOW PHASE NOISE MICROWAVE >
20  REM ! SYNTHESIZER ALGORITHM !
30  REM ! ULPNALG USES A 1,2,4 PRESCALER BETWEEN THE LO AND THE SAMPLER. !
40  REM ! THE PURPOSE IS TO REDUCE THE HARMONIC NUMBER OF THE SAMPLER > !
50  REM ! FROM 8 THRU 23. THE COARSE LOOP IS NOW A SUMMING LOOP WITH A !
60  REM ! DIVIDE BY H DRIVING IT. THE DIVIDE BY H INPUT IS A 80 MHz TO > !
70  REM ! 1180 MHz 10 MHz RESOLUTION SYNTHESIZER. THE ACTUAL SYNTHESIZER > !
80  REM ! IS A 600 MHz TO 1180 MHz LOOP FOLLOWED BY A DIV/1,2,4,8. !
90  REM ! THE DIV/H AND DIV/L ARE COMBINED INTO A DIV/R, (DIV/R=DIV/H*1). !
100 REM ! THE RESULTS LEAD TO A −130.6 TO −116.1 dBC/Hz @ 10 KHz OFFSET > !
110 REM ! AT 2 AND 20 GHz RESPECTIVLY. !
120 CLS :KEY OFF
130 INPUT "INPUT F(MHz)";FI#
140 IF FI#<2000 OR FI#>20000 THEN PRINT "(2 TO 20 GHz)": GOTO 130
150 F1#=INT(.5+FI#*100000000#)/100000000#:REM ! .01 Hz RESOLUTION !
160 REM ! CALCULATE SAMPLER LO FOR 30 TO 40 MHz IF !
170 P=4 :REM ! SAMPLER LO PRESCALER=4, IF=37.5-40 MHz !
180 IF F1#>5187.5 THEN P=2 :REM ! SAMPLER PRESCALER=2. IF=35-40 MHz !
190 IF F1#>10860 THEN P=1 :REM ! SAMPLER PRESCALER=1, IF=30-40 MHz !
200 F=10*INT(F1#*P/10)/P :REM ! INPUT FREQUENCY SCALED TO SAMPLER LO
    RESOLUTION !
210 H1=1+INT(P*(F-43)/980) :REM ! SAMPLER HARMONIC # FOR (+) POLARITY !
220 H2=1+INT(P*(F+31)/980) :REM ! SAMPLER HARMONIC # FOR (−) POLARITY !
230 P1=H2-H1 :REM ! SAMPLER MIX POLARITY 0=−, 1=+ !
240 ENPOL=P1 :REM ! YIG LOOP POLARITY ! ENPOL=1, POL=+ ! ENPOL=0, POL=− !
250 P2=40-10*P1*(8-(1/P)) :REM ! SUM LOOP FREQUENCY SHIFT FOR POLARITY
    REVERSAL, 40 MHZ FOR (−) POLARITY, −30,−35,−37.5 FOR (+) POLARITY !
260 F19=(F+P2)/H1 :REM ! SAMPLER LO !
270 F20=P*F19 :REM ! SUM LOOP FREQUENCY, DIV/P INPUT !
280 F13=F20-900 :EN900=1 : REM ! SUM LOOP INPUT USING 900 MHz OFFSET,
    POLARITY (+) !
290 IF F20>950 THEN F13=1000-F20 :EN900=0 :REM ! SUM LOOP INPUT USING 1000 MHz
    OFFSET, POLARITY (−) !
300 REM ! CALCULATE EXACT FREQUENCIES GIVEN 10 MHz RESOLUTION SUM LOOP
    SYNTHESIZER COVERING 80 TO 1180 MHz !
310 F14#=10#*INT(.5+H1*F13/10) :REM ! RECALCULATE DIV/H INPUT TO 10 MHz
    RESOLUTION USING HIGH PRECISION !
320 REM ! DETERMINE DIV/L VALUE 1,2,4 OR 8 !
330 L=8 :REM ! 80 TO 140 MHz !
340 IF F14#>141 THEN L=4 :REM ! 150 TO 290 MHz !
350 IF F14#>291 THEN L=2 :REM ! 300 TO 590 MHz !
360 IF F14#>591 THEN L=1 :REM ! 600 TO 1180 MHz !
370 H#=INT(H1+.5) :L#=INT(L+.5) : P#=INT(P+.5) :REM ! CONVERT TO HIGH PRECISION
380 F15#=F14#/H#:REM ! NEW SUM LOOP INPUT !
390 F16#=1000#-F15#:REM ! NEW FLO USING 1000 MHz OFFSET !
400 IF EN900=1 THEN F16#=900#+F15#:REM ! NEW FLO USING 900 MHz OFFSET !
410 N%=F14#*L#/10#:REM ! N1 USED FOR 600 TO 1180 MHz SYNTHESIZER !
420 R%=H#*L.#:REM ! R USED FOR H*L DIVIDER !
430 P%=P#:REM ! P USED FOR SAMPLER PRESCALER !
440 FS#=F16#/P#:REM ! NEW SAMPLER LO FREQUENCY !
450 F17#=ABS(H#*FS#-F1#) :REM ! SAMPLER IF OUTPUT !
460 F18#=INT(.5+100000000#*F17#)/100#REM ! SAMPLER IF OUTPUT .01 Hz RESOLUTION
    FINE LOOP REFERENCE FREQUENCY !
470 PRINT
480 PRINT " Fo(MHz) F-fine-(Hz) P R N1 POL1 POL2
    "
490 PRINT "--------------------------------------------------------------
    -"
500 POL1$="-":POL2$="-"
INPUT F(MHz)? 2000
```

-continued
APPENDIX

| Fo(MHz) | Ffine(Hz) | P | R | N1 | POL1 | POL2 |
|---|---|---|---|---|---|---|
| 2000.00000000 | 37500000.00 | 4 | 32 | 60 | + | − |
| INPUT F(MHz)? | 2000.00000001 | | | | | |
| Fo(MHz) | Ffine(Hz) | P | R | N1 | POL1 | POL2 |
| 2000.00000001 | 37500000.01 | 4 | 32 | 60 | + | − |
| INPUT F(MHz)? | 12345.67891234 | | | | | |
| Fo(MHz) | Ffine(Hz) | P | R | N1 | POL1 | POL2 |
| 12345.67891234 | 34321087.66 | 1 | 13 | 62 | − | − |
| INPUT F(MHz)? | 19999.99999999 | | | | | |
| Fo(MHz) | Ffine(Hz) | P | R | N1 | POL1 | POL2 |
| 19999.99999999 | 30000000.01 | 1 | 21 | 97 | − | − |
| INPUT F(MHz)? | 20000 | | | | | |
| Fo(MHz) | Ffine(Hz) | P | R | N1 | POL1 | POL2 |
| 20000.00000000 | 40000000.00 | 1 | 21 | 96 | − | − |
| INPUT F(MHz)? | 2000 | | | | | |
| Fo(MHz) | Ffine(Hz) | P | R | N1 | POL1 | POL2 |
| 2000.00000000 | 35700000.00 | 4 | 32 | 60 | + | − |
| INPUT F(MHz)? | 2000.00000001 | | | | | |
| Fo(MHz) | Ffine(Hz) | P | R | N1 | POL1 | POL2 |
| 2000.00000001 | 37500000.01 | 4 | 32 | 60 | + | − |
| INPUT F(MHz)? | 12345.67991234 | | | | | |
| Fo(MHz) | Ffine(Hz) | P | R | N1 | POL1 | POL2 |
| 12345.67891234 | 34321087.66 | 1 | 13 | 62 | − | − |
| INPUT F(MHz)? | 19999.99999999 | | | | | |
| Fo(MHz) | Ffine(Hz) | P | R | N1 | POL1 | POL2 |
| 19999.99999999 | 30000000.01 | 1 | 21 | 97 | − | − |
| INPUT F(MHz)? | 20000 | | | | | |
| Fo(MHz) | Ffine(Hz) | P | R | N1 | POL1 | POL2 |
| 20000.00000000 | 40000000.00 | 1 | 21 | 96 | − | − |

What is claimed is:

1. An ultra low phase noise microwave synthesizer for providing an output signal having a frequency $F_O$ comprising:
   a first voltage controlled oscillator (VCO);
   first frequency comparing means for driving said first VCO to a first selected frequency ($F_{idle}$);
   first means including a first harmonic sampler for phase locking said first VCO to said first selected frequency ($F_{idle}$);
   a second VCO;
   second frequency comparing means coupled to said first VCO for driving said second VCO to a second selected frequency ($F_{coarse}$);
   second means coupled to said first VCO including a second harmonic sampler for phase locking said second VCO to said second selected frequency ($F_{coarse}$);
   a third VCO; and
   third means coupled to said second VCO including a third harmonic sampler for phase locking said third VCO to said frequency $F_O$.

2. A synthesizer according to claim 1 wherein said first selected frequency ($F_{idle}$) is within a first predetermined range of frequencies.

3. A synthesizer according to claim 1 wherein said second selected frequency ($F_{coarse}$) is within a second predetermined range of frequencies.

4. A synthesizer according to claim 1 wherein said third selected frequency ($F_O$) is within a third predetermined range of frequencies.

5. A synthesizer according to claim 2 wherein said first predetermined range of frequencies is 600 MHz to 1180 MHz.

6. A synthesizer according to claim 3 wherein said second predetermined range of frequencies is 908.3 MHz to 983.3 MHz.

7. A synthesizer according to claim 4 wherein said third predetermined range of frequencies is 2 GHz to 20 GHz.

8. A synthesizer according to claim 1 wherein said first frequency comparing means for driving said first VCO to a first selected frequency ($F_{idle}$) comprises means for providing a first error signal and said first means including a first harmonic sampler for phase locking said first VCO to said first selected frequency ($F_{idle}$) comprises means for providing a second error signal and further comprising means responsive to said first and said second error signals for providing a control voltage for said first VCO.

9. A synthesizer according to claim 8 wherein said means for providing said control voltage for said first VCO comprises means for summing said first and second error signals.

10. A synthesizer according to claim 8 wherein said means for providing said first error signal comprises frequency comparing means responsive to a control signal corresponding to said first selected frequency ($F_{idle}$), a reference frequency ($F_{step}$) and the frequency of the first VCO until the first VCO is providing said first selected frequency ($F_{idle}$) and said means for providing the second error signal comprises phase locking means for providing the second error signal in response to the relative phase of a harmonic of said reference frequency ($F_{step}$) and the output of said first VCO when it is providing said frequency $F_{idle}$.

11. A synthesizer according to claim 1 wherein said second frequency comparing means for driving said second VCO to a second selected frequency ($F_{coarse}$) comprises means for providing a first error signal and said second means including a second harmonic sampler for phase locking said second VCO to said second selected frequency ($F_{coarse}$) comprises means for providing a second error signal and further comprising means responsive to said first and said second error signals from said second frequency comparing means and said second phase locking means, respectively, for providing a control voltage for said second VCO.

12. A synthesizer according to claim 11 wherein said means for providing said control voltage for said second VCO comprises means for summing said first and second error signals from said second frequency comparing means and said second phase locking means.

13. A synthesizer according to claim 11 wherein said means for providing said first error signal from said second frequency comparing means comprises means responsive to a control signal corresponding to said second selected frequency ($F_{coarse}$), said frequency ($F_{idle}$) and a frequency $F_D$ equal to the difference between the frequency of the second VCO and a selected reference frequency and said means for providing the second error signal from said second phase locking means comprises means for providing the second error signal in response to the relative phase of a harmonic of said frequency ($F_D$) and the output of said first VCO when said second VCO is providing said frequency $F_{coarse}$.

14. A synthesizer according to claim 13 wherein said selected reference frequency comprises a first selected reference frequency $F_{ref1}$ if the second selected frequency ($F_{coarse}$) is greater than or equal to a predetermined frequency and a second selected reference frequency $F_{ref2}$ if the second selected frequency ($F_{coarse}$) is less than said predetermined frequency.

15. A synthesizer according to claim 14 comprising:
an oscillator having a predetermined frequency;
a first multiplier responsive to said predetermined frequency for providing said first selected reference frequency $F_{ref1}$;
a second multiplier responsive to said predetermined frequency for providing said second selected reference frequency $F_{ref2}$; and
a mixer responsive to said first selected reference frequency $F_{ref1}$ if the second selected frequency ($F_{coarse}$) is greater than or equal to a predetermined frequency or said second selected reference frequency $F_{ref2}$ if the second selected frequency ($F_{coarse}$) is less than said predetermined frequency and said second selected frequency ($F_{coarse}$) for providing said frequency ($F_D$).

16. A synthesizer according to claim 15 comprising:
means for inverting the signal applied to the voltage control input of the second VCO when the second selected frequency ($F_{coarse}$) is greater than or equal to a predetermined frequency.

17. A synthesizer according to claim 15 wherein said second selected frequency $F_{coarse}$ is from 908.3 MHz to 983.3 MHz, said predetermined frequency is 950 MHz, said first selected reference frequency $F_{ref1}$ is 1000 MHz and said second selected reference frequency $F_{ref2}$ is 900 MHz.

18. A synthesizer according to claim 1 wherein said third means coupled to said second VCO including a third harmonic sampler for phase locking said third VCO to said frequency $F_O$ comprises:
a programmable divider for providing an output signal having a frequency $F_S$ which is a fraction 1/P of the second selected frequency $F_{coarse}$;
means including said third harmonic sampler for sampling the output of said third VCO at said frequency $F_S$ for providing an error signal; and
means, including a means for detecting the phase difference between a signal having a reference frequency $F_{fine}$ and said error signal, for providing a control voltage for controlling the frequency $F_O$ of said third VCO.

19. A synthesizer according to claim 18 wherein said fraction 1/P is selected from among 1/1, 1/2 and 1/4.

20. A synthesizer according to claim 18 wherein said reference frequency $F_{fine}$ is from 30 MHz to 40 MHz.

21. A synthesizer according to claim 18 wherein said frequency $F_O$ covers the frequency range of 2 GHz to 20 GHz.

* * * * *